United States Patent
Miller et al.

(10) Patent No.: US 11,165,264 B2
(45) Date of Patent: Nov. 2, 2021

(54) BATTERY MANAGEMENT SYSTEMS HAVING BATTERY FAILURE DETECTION AND RELATED METHODS AND UNINTERRUPTIBLE POWER SUPPLIES (UPSS)

(71) Applicant: Eaton Intelligent Power Limited, Dublin (IE)

(72) Inventors: David Glenn Miller, Clayton, NC (US); Pradeep Kumar Nandam, Cary, NC (US)

(73) Assignee: Eaton Intelligent Power Limited, Dublin (IE)

( * ) Notice: Subject to any disclaimer, the term of this patent is extended or adjusted under 35 U.S.C. 154(b) by 106 days.

(21) Appl. No.: 15/176,242

(22) Filed: Jun. 8, 2016

(65) Prior Publication Data
US 2017/0358934 A1    Dec. 14, 2017

(51) Int. Cl.
| | |
|---|---|
| *H02J 7/00* | (2006.01) |
| *H02J 9/06* | (2006.01) |
| *G01R 31/392* | (2019.01) |
| *G01R 19/165* | (2006.01) |
| *G01R 31/36* | (2020.01) |
| *G01R 31/396* | (2019.01) |

(Continued)

(52) U.S. Cl.
CPC ...... *H02J 7/0024* (2013.01); *G01R 19/16542* (2013.01); *G01R 31/3648* (2013.01); *G01R 31/392* (2019.01); *H02J 7/007* (2013.01); *H02J 7/0021* (2013.01); *H02J 7/0026* (2013.01); *H02J 9/06* (2013.01); *G01R 31/3835* (2019.01); *G01R 31/396* (2019.01); *G01R 31/42* (2013.01)

(58) Field of Classification Search
CPC ...... H02J 7/0024; H02J 7/0021; H02J 7/0026; H02J 7/007; H02J 9/06; G01R 31/392; G01R 19/16542; G01R 31/3648; G01R 31/396; G01R 31/3835; G01R 31/42
See application file for complete search history.

(56) References Cited

U.S. PATENT DOCUMENTS

| | | | | |
|---|---|---|---|---|
| 5,537,024 A | * | 7/1996 | Lang ................ | G01R 19/16542 320/DIG. 21 |
| 5,621,298 A | * | 4/1997 | Harvey .............. | G01R 31/3648 320/134 |

(Continued)

OTHER PUBLICATIONS

"Advanced Battery Management (ABM) and Battery Testing in Eaton UPS," Eaton Corporation, White Paper, Jul. 2009, 6 pages.
(Continued)

*Primary Examiner* — Carlos Amaya
(74) *Attorney, Agent, or Firm* — Stanek Lemon Crouse & Meeks, PA

(57) ABSTRACT

Uninterruptible power supplies (UPSs) are provided including a processor and a voltage sensor circuit in communication with the processor. The voltage sensor circuit is configured to sense a center point voltage (CPV) of a battery module associated with the UPS and provide the sensed CPV to the processor. The processor is configured to receive the sensed CPV of the battery module, determine if the CPV is less than a predetermined voltage and turn off all battery chargers associated with the battery module if the CPV is determined to be less than the predetermined voltage.

19 Claims, 7 Drawing Sheets

(51) Int. Cl.
*G01R 31/3835* (2019.01)
*G01R 31/42* (2006.01)

(56) References Cited

U.S. PATENT DOCUMENTS

| | | | | |
|---|---|---|---|---|
| 5,895,440 | A * | 4/1999 | Proctor | B60L 3/12 |
| | | | | 702/63 |
| 6,225,842 | B1 * | 5/2001 | Fujita | H02J 7/0026 |
| | | | | 327/135 |
| 6,583,603 | B1 | 6/2003 | Baldwin | |
| 2001/0033502 | A1 | 10/2001 | Blair et al. | |
| 2002/0136042 | A1 | 9/2002 | Layden et al. | |
| 2010/0240419 | A1 * | 9/2010 | Horino | H02J 7/0047 |
| | | | | 455/572 |
| 2013/0127611 | A1 * | 5/2013 | Bernstein | G08B 21/18 |
| | | | | 340/455 |

OTHER PUBLICATIONS

Glad et al., "Middle Point Voltage Comparison as a Simple and Practical but Effective Way to Ensure Battery System's Capacity to Perform," Proceedings of the International Telecommunications Energy Conference (INTELEC), Kyoto, Nov. 5-8, 1991, vol. Conf. 13, pp. 189-195.

Thiim A/S, "Battery Symmetry Monitoring Relay," Mar. 24, 2016, Retrieved from the Internet on Aug. 9, 2017, URL: http://thiim.com/TradePoint141/ItemImages/40662/BMSA.pdf.

Notification of Transmittal of the International Search Report and the Written Opinion of the International Searching Authority, PCT/US2017/032596, dated Aug. 23, 2017, 12 pages.

Notification Concerning Transmittal of International Preliminary Report on Patentability, PCT/US2017/032596, dated Dec. 20, 2018, 8 pages.

* cited by examiner

BATTERY MANAGEMENT SYSTEMS HAVING BATTERY FAILURE DETECTION AND RELATED METHODS AND UNINTERRUPTIBLE POWER SUPPLIES (UPSS)

FIELD

The inventive concept relates generally to uninterruptible power supplies (UPSs) and, more particularly, to detection of failure of batteries associated with UPSs.

BACKGROUND

Uninterruptible power supply (UPS) systems are commonly used in installations such as data centers, medical centers and industrial facilities. UPS systems may be used in such installations to provide backup power to maintain operation of computer, medical devices and other critical equipment in event of failure of a primary utility supply. These UPS systems commonly have an "on-line" configuration including a rectifier and inverter coupled by a DC link that is also coupled to a backup power source, such as a battery. Other UPS configurations may also be used, such as standby and line-interactive configurations.

In most UPSs, the battery modules are one of the most important components. For this reason, they typically require regular and periodic maintenance/inspection. Maintaining these batteries requires the ability to detect when a battery has failed. In modular UPSs that use lead-acid type batteries, with multiple battery modules connected in parallel, it may be very difficult to detect a battery failure.

Advanced battery management offered by Eaton is very effective in extending battery life, but may not be as effective when multiple battery modules are connected in parallel. Thus, bad batteries could still escape detection possibly causing overcharging and failure of batteries. Improved methods for detection of battery failures in parallel battery modules are desired.

SUMMARY

Some embodiments of the inventive concept provide an uninterruptible power supply (UPS) including a processor and a voltage sensor circuit in communication with the processor. The voltage sensor circuit is configured to sense a center point voltage (CPV) of a battery module associated with the UPS and provide the sensed CPV to the processor. The processor is configured to receive the sensed CPV of the battery module, determine if the CPV is less than a predetermined voltage and turn off all battery chargers associated with the battery module if the CPV is determined to be less than the predetermined voltage.

In further embodiments of the present inventive concept, the processor may be further configured to notify a customer of a particular slot in which the battery module is positioned if the CPV is determined to be less than the predetermined voltage. The processor may be further configured to sound an alarm responsive to determining that the CPV is less than the predetermined voltage.

In still further embodiments, the UPS may include at least one battery string.

In some embodiments, the battery module may be positioned in an external battery module (EBM) in communication with the UPS.

In further embodiments, the predetermined threshold may be no greater than 2.3 volts per cell (V/cell).

Still further embodiments of the present inventive concept provide a system for detection of battery failures. The system includes an uninterruptible power supply (UPS); a processor associated with the UPS; a battery module associated with the UPS and the processor; and a voltage sensor circuit in communication with the processor. The voltage sensor circuit is configured to sense a center point voltage (CPV) of the battery module associated with the UPS and provide the sensed CPV to the processor. The processor is configured to receive the sensed CPV of the battery module, determine if the CPV is less than a predetermined voltage and turn off all battery chargers associated with the battery module if the CPV is determined to be less than the predetermined voltage.

Some embodiments of the present inventive concept provide methods for detecting battery failures including sensing a center point voltage (CPV) of a battery module associated with a UPS; providing the sensed CPV to a processor; determining if the CPV is less than a predetermined voltage; and turning off all battery chargers associated with the battery module if the CPV is determined to be less than the predetermined voltage.

DETAILED DESCRIPTION

Figure 1:
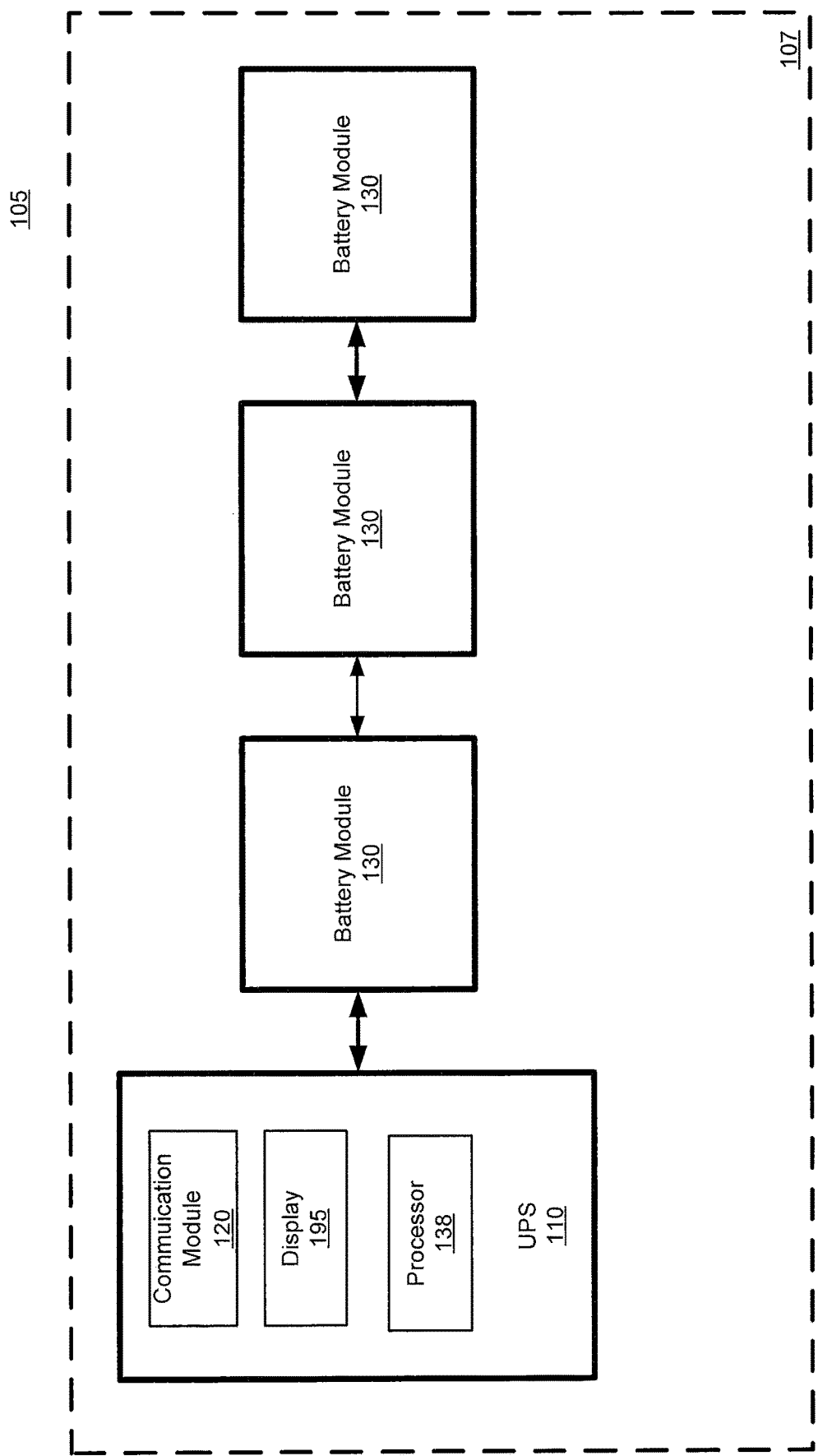
FIG. 1 is a block diagram of a system including an uninterruptible power supply (UPS) and a plurality of battery modules in accordance with some embodiments of the present inventive concept.

Specific example embodiments of the inventive concept now will be described with reference to the accompanying drawings. This inventive concept may, however, be embodied in many different forms and should not be construed as limited to the embodiments set forth herein; rather, these embodiments are provided so that this disclosure will be thorough and complete, and will fully convey the scope of the inventive concept to those skilled in the art. In the drawings, like numbers refer to like elements. It will be understood that when an element is referred to as being "connected" or "coupled" to another element, it can be directly connected or coupled to the other element or intervening elements may be present. As used herein the term "and/or" includes any and all combinations of one or more of the associated listed items.

The terminology used herein is for the purpose of describing particular embodiments only and is not intended to be limiting of the inventive concept. As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the specification and the relevant art and will not be interpreted in an idealized or overly formal sense unless expressly so defined herein As discussed above, Advanced Battery Management (ABM) techniques used in Eaton's Uninterruptible Power Supplies (UPSs) are very effective in extending battery life. However, they may not be as effective in the case of multiple battery modules connected in parallel, and bad batteries could still escape detection, which may cause overcharging and failure of batteries. Accordingly, some embodiments of the present inventive concept provide methods and systems suited for UPSs that use parallel battery modules.

In particular, embodiments of the present inventive concept provide detection of bad batteries in parallel connected battery modules. Consequently, battery management techniques used in Eaton's ABM can be used much more effectively in parallel battery systems. This may allow for much more effective control of the battery charger, thus, possibly avoiding overcharge and failure of any of the batteries in the parallel connected battery modules, which will be discussed further below with respect to FIGS. 1 through 6.

For reasons discussed above, when a battery module fails, the firmware (software) in the UPS needs to be able to detect that the battery module has failed. Detection of battery failure is not an easy task because there is typically a capacitor in the UPS that is parallel to the battery, to reduce the battery current ripple. The capacitor has a voltage that is equal to the battery voltage. Therefore, the circuitry that measures the battery voltage and feeds that information back to the micro-controller or digital signal processor (DSP) in the UPS still keeps measuring the battery voltage across the capacitor even after the battery module fails. This is especially true when a battery charger is still operating and maintains a constant charge voltage. This problem is exacerbated when dealing with parallel connected strings of batteries or in modular UPSs, where there are more than one set of battery strings connected to a common direct current (DC) Bus. In these embodiments, even when one battery module fails, the battery bus voltage is still unchanged as many other strings are connected to the same DC Bus. Consequently, the firmware in the UPS cannot detect that the battery module has failed. The customer cannot be notified, for example, with an alarm, that the battery module has failed if the system is unable to detect the failure.

The inability to detect failure of battery modules could cause major issues for the customer if, for example, the input alternating current (AC) power were to fail. In this scenario, the UPS would still try to transfer to battery and, because the battery is not working, the UPS will drop the load if this occurs in a single battery module UPS. No alarm may be logged that may help in tracing and troubleshooting the cause for the load drop. Even if the input AC power does not fail, but one or more battery module(s) in a multi-module UPS fails, the UPS firmware will not be able to detect the failure of the battery modules. Thus, the battery remaining time (BTR) estimate will be incorrect. This may result in the software that monitors the UPS to incorrectly shut down the load either too early, or delay it so much that the load may get dropped unintentionally. Accordingly, some embodiments of the present inventive concept provide improved methods and systems for detecting the battery failures in single and modular UPSs.

Some embodiments of the present inventive concept provide the detection of failed battery modules by using a center point voltage (CPV) of each battery module. In particular, a CPV of each battery module is detected and is sensed by a control processor. Thus, the processor is not just sensing an overall battery bus voltage, which as discussed above, would have made the processor blind to an individual battery module's issues. Hence, as the processor detects the center point of each battery module, it can be determined if any individual module has a problem battery in it. Once it is determined that a bad battery is present in any module, all battery chargers associated with the module may be turned off and the customer may be notified which battery module has a failed battery including the particular slot and chassis in which the battery is installed. At this point, the customer can simply replace the failed battery module identified in accordance with some embodiments of the present inventive concept and, therefore, reduce the likelihood, or possible avoid, messy thermal failures that could have occurred had the processor been blind to the individual battery module problem. Embodiments of the present inventive concept not only provides notice of battery failures, but may also extend the benefits of an ABM to parallel battery systems and make it much more effective as will be discussed further below with respect to FIGS. 1 through 8.

It will be understood that although embodiments of the present inventive concept are discussed in conjunction with an ABM, embodiments of the present inventive concept are not limited to this configuration. Embodiments of the present invention may be used to detect failed batteries in systems without an ABM without departing from the scope of the present inventive concept.

Referring now to FIG. 1, a system in accordance with some embodiments of the present inventive concept will be discussed. As illustrated in FIG. 1, the system may include a UPS 110 and a plurality of battery modules 130. In some embodiments, the battery modules 130 may be multiple parallel strings of batteries connected to a common DC Bus. As will be discussed further below, UPSs according to embodiments discussed herein may be UPSs having a single string battery, a multi-string battery and/or a multi-module multi-string battery without departing from the scope of the present inventive concept. The battery modules 130 may be installed in the UPS chassis or may be separate therefrom. For example, in some embodiments, the batteries may be provided by external battery modules (EBMs). The EBMs may have their own chassis.

As further illustrated in FIG. 1, the UPS 110 includes a communication module 120, a processor 138 and a display 195. The communication module 120/processor 138 of the UPS is configured to receive information, including voltages, from the battery modules 130 and provide an alarm and/or visual indication on the display 195 that a battery module 130 has failed. It will be understood that although the communications module 120 and processor 138 are shown as separate modules, embodiments of the present inventive concept are not limited thereto. The modules may be combined into one module or split into more than two without departing from the scope of the present inventive concept.

Figure 2:
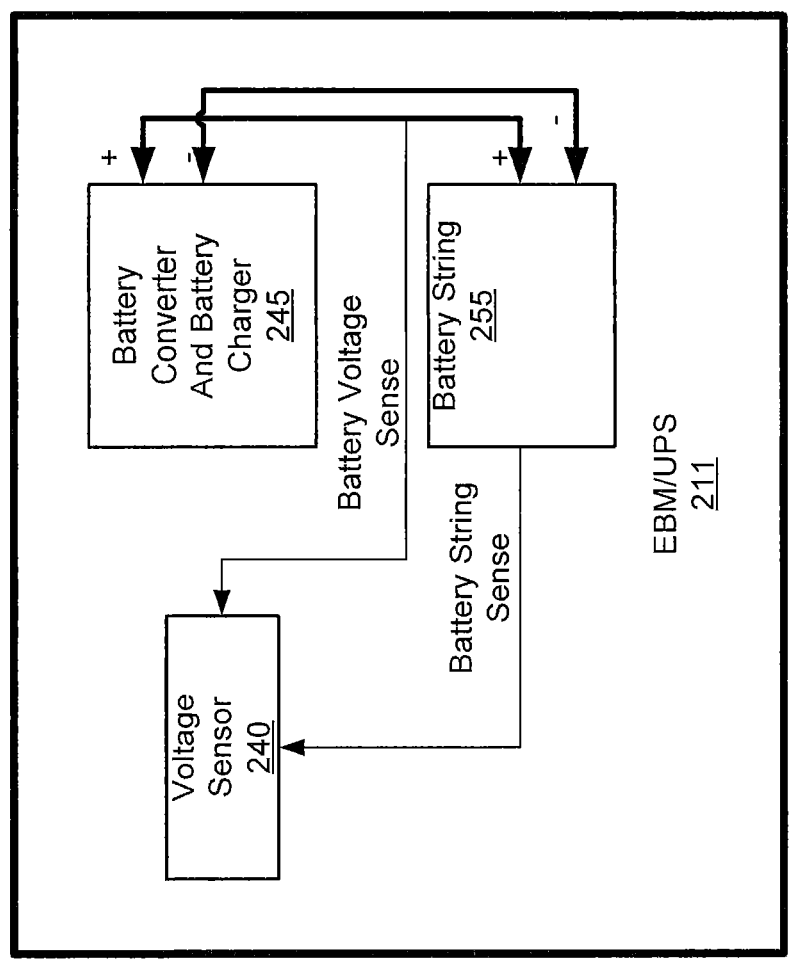
FIG. 2 is a block diagram of a UPS having a single string battery in accordance with some embodiments of the present inventive concept.
Figure 3:
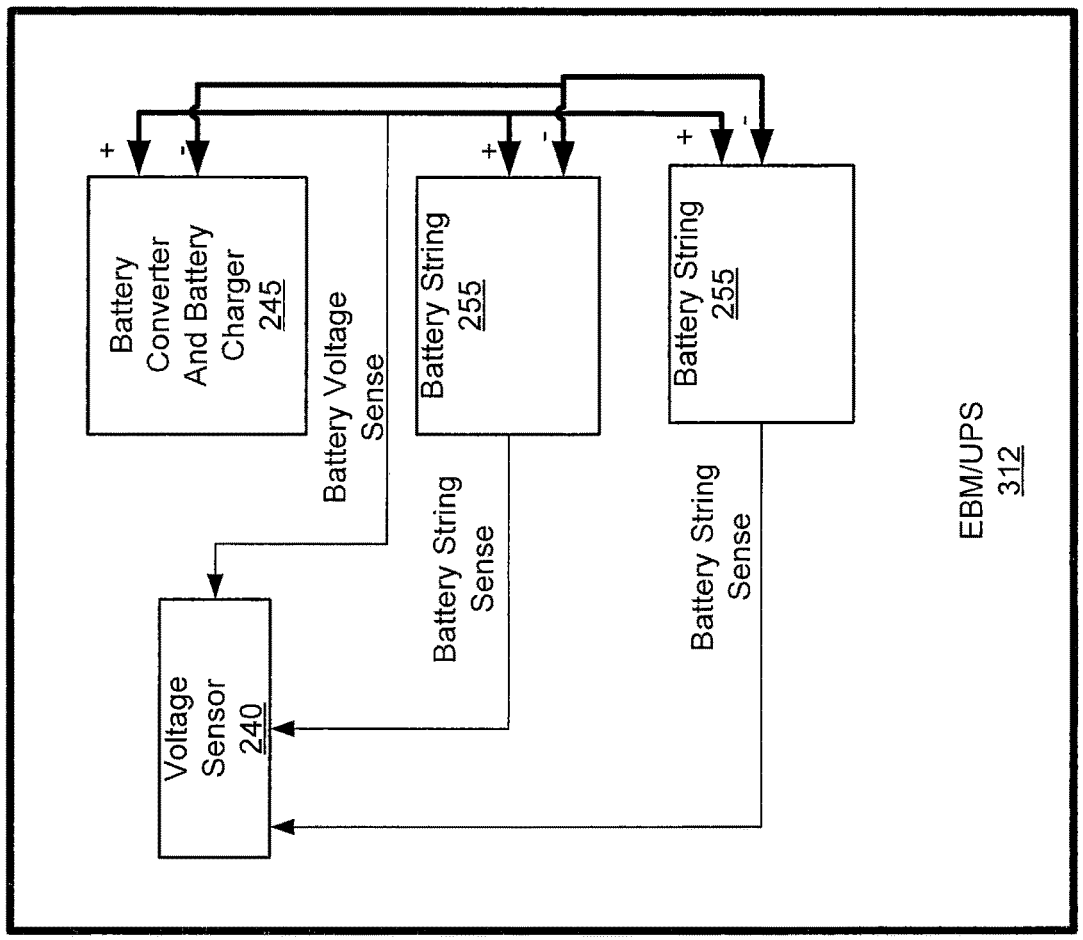
FIG. 3 is a block diagram of a UPS having a multi-string battery in accordance with some embodiments of the present inventive concept.
Figure 4:
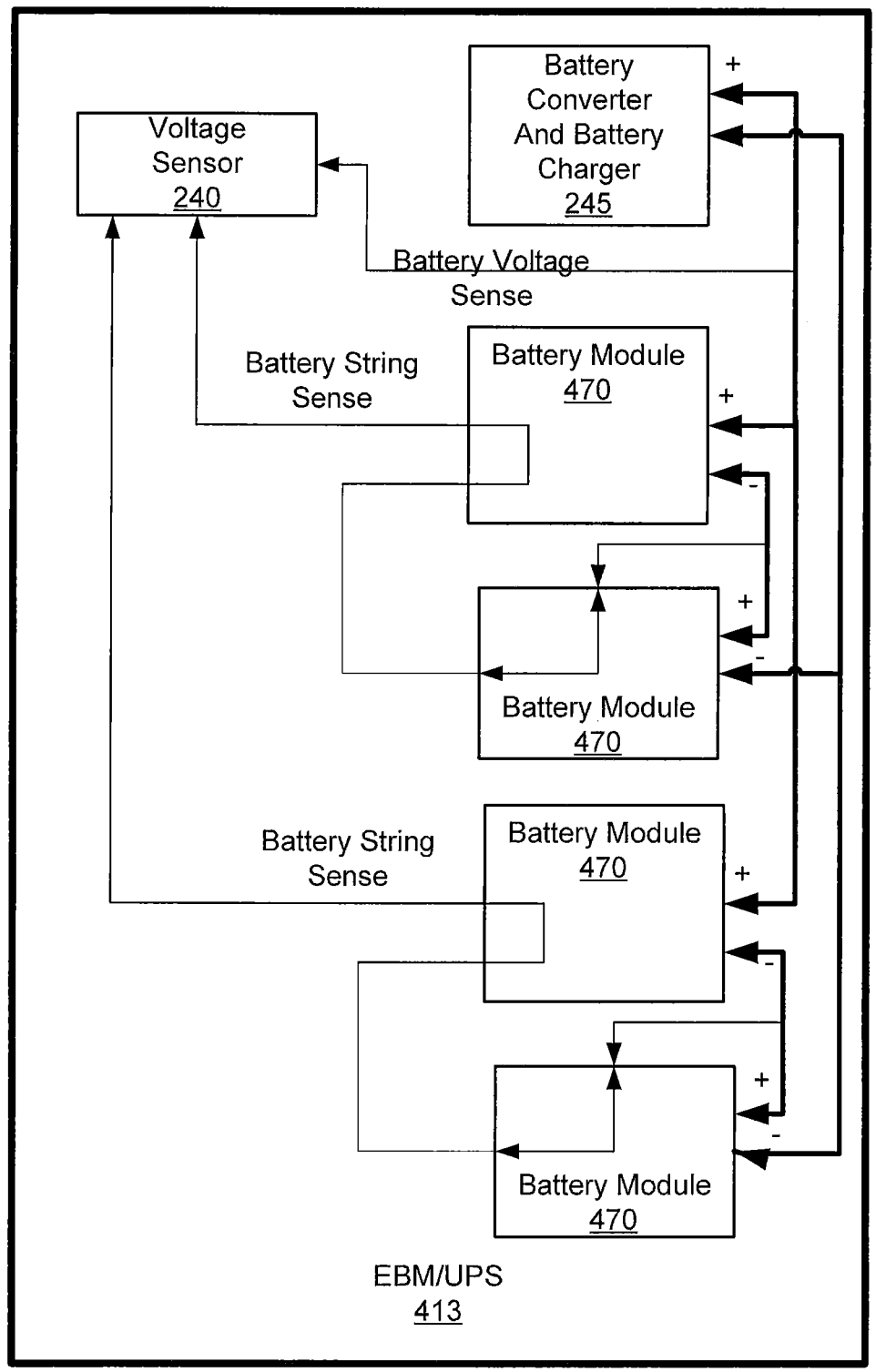
FIG. 4 is a block diagram of a UPS having a multi-module multi-string battery in accordance with some embodiments of the present inventive concept.

Referring now to FIGS. 2-4, various embodiments of UPSs in accordance with some embodiments of the present inventive concept will be discussed. Referring first to FIG. 2, a UPS having a single string battery will be discussed. As illustrated in FIG. 2, the UPS 211 includes a voltage sensor 240, a battery converter and a battery charger 245 and a battery string 255. As illustrated, a battery sense voltage and battery string sense are provided to the voltage sensor 240. The battery string sense and/or the battery voltage sense may be used to detect the center point voltage (CPV) by the processor 138/communication module 120 (FIG. 1).

In particular, the ABM can extend the life of the battery. The battery system in a UPS forms the heart of the power protection benefit to the user. It is a key element which performs many functions, two of which are delivering energy during a power outage; and storing energy efficiently for extended periods of time. That stored energy is instantaneously available when needed to support the critical load on the UPS. In order to perform the above functions reliably, the charge level on the battery must be maintained. At the same time, it is desired that the battery charge be controlled to maximize system efficiency and, more importantly, to maximize the service life of the battery system.

The ABM charging system is a set of charger controls, and automated battery tests. Cyclic charging schemes like ABM allow for periods of time where the battery is being fully charged, and periods of time when the charger is disabled. This reduces the time that the battery is being overcharged when compared to a traditional float charger. This reduction in overcharging yields a measurable increase in battery life for UPS applications.

One mode of the ABM system is a charge mode. The UPS enters Charge mode under any of the following conditions: whenever the UPS is commanded to turn on; after any Utility power outage, lasting longer than 15 seconds; and whenever the battery is replaced (or the battery breaker is opened and re-closed). In Charge mode, bulk charging of the batteries is used to recharge a discharged battery after a power outage, or whenever the ABM process is restarted. Charge voltage target is set to 2.30 V/cell, and charge current will be greater than 0.1 C A. Bulk charging lasts only as long as it takes to bring the battery system up to a predetermined float level. Typically, there is a 100-hour maximum time limit. Once this level is reached, the UPS battery charger enters a constant voltage mode, maintaining a 2.3 V/cell level. Current is at trickle charge levels during this time, and a 24-hour clock is started. At the end of 24 hours of float charging, the UPS automatically performs a battery test at two different load levels to verify that the battery is performing, and to collect data for comparison to previous and subsequent automatic battery tests. If the test should fail, an alarm is annunciated on the UPS and also through the remote monitoring system that may be connected to the UPS. At the end of the test, the charger resumes constant voltage mode, and remains in that state for an additional 24 hours.

Rest mode begins at the end of Charge mode; that is, after 48 hours of float charging, and after a successful battery test. In Rest mode, the battery charger is completely turned off. The battery system receives no charge current during this mode, which lasts about 28 days. Then, the Charge mode is repeated as described above. It is clear, then, that the battery spends most of its time in Rest mode. As a result, the following benefits are realized:

Rest mode begins at the end of Charge mode. In particular, after 48 hours of float charging, and after a successful battery test. In Rest mode, the battery charger is completely turned off. The battery system receives no charge current during this mode. In some embodiments, rest mode may be about 28 days. After rest mode, the charge mode is repeated as discussed above. Thus, the battery spends most of its time in rest mode. Accordingly, the following benefits may be realized:

The battery may not be subjected to forced charge current; therefore, overcharging may not be possible; thermal runaway may not be a concern with the charger off; the battery system cannot be damaged by ripple currents, since the charger is off; and the likelihood of positive grid corrosion is greatly reduced, allowing extended service life. During Rest mode, the open circuit battery voltage is monitored constantly, and battery charging is resumed if any of the following occur: a power outage lasting longer than 15 seconds occurs; the open circuit voltage(OCV) of the battery drops below 2.1 V/cell after 10 days of rest mode; if OCV drops below 2.1V during the first 10 days, an alarm is triggered; 28-day timer expires (end of Rest Mode); and the battery is replaced, or the breaker is opened and re-closed There are two other battery tests that are performed as a part of the ABM cycle. The first of these is meant to detect battery conditions which could lead to thermal runaway. The bulk charging period is timed and if the float voltage is not reached in a predetermined time an alarm is signaled, and the charger shut down. The second test is performed after the charge cycle is completed, i.e. at the beginning of rest mode. The battery is discharged for twenty five percent of the expected discharge time. Upon reaching this point the battery voltage is measured. If the voltage is below a specified threshold, dependent on the load, then an alarm is signaled indicating the battery is nearing the end of its service life and should be replaced.

Thus, as discussed the ABM is configured to run specific tests to detect failing batteries. However, this may not be as useful when the batteries are in a string. Accordingly, some embodiments of the present inventive concept sense the CPV voltage of the fully charged individual battery string and use the center point voltage to determine if a battery in the string has failed. Thus, embodiments of the present inventive concept allow detection of bad batteries on a string level rather than waiting for all batteries to fail before a problem is detected.

As used herein, "CPV" refers to a predetermined range. The CPV does not necessarily indicate a charge voltage of half a total voltage, but is voltage/cell after 24 hours of being charged. For example, in some embodiments, as discussed above, after 24 hours of charge the center point voltage should be about 2.3V/cell. If the CPV is less than this after 24 hours of charge, this is an indication of battery failure.

Referring now to FIG. 3, a UPS 312 having multiple battery strings 255 will be discussed. Operations of the UPS 312 are similar to those discussed above with respect to FIG. 2, but more than one CPV will be sensed by the voltage sensor 240. Thus, no matter which battery fails from any string, an alarm can be triggered.

Referring now to FIG. 4, a UPS 413 having multiple modules and multiple strings 470 will be discussed. Again, operations of the UPS 413 are similar to those discussed above with respect to FIG. 2, but more than one CPV will be sensed by the voltage sensor 240. Thus, no matter which battery fails from any string or module, an alarm can be triggered. Thus, according to some embodiments of the present inventive concept, in a modular UPS with multiple strings of battery modules connected to a common DC bus, embodiments of the present inventive concept can detect a CPV of the battery string without using any complicated capacitive circuits.

It will be understood that FIGS. 2-4 are provided for example purposes only and, therefore, embodiments of the present inventive concept should not be limited to this configuration. For example, in a modular UPS design in accordance with some embodiments, in order to reduce the weight of the battery module, a string of ten batteries may split into two battery modules with five batteries per each module without departing from the scope of the present inventive concept.

In accordance with some embodiments, a CPV of each of battery string is monitored and when the CPV is below a threshold level, this is an indication that the battery has failed. Thus, embodiments of the present inventive concept provide methods and systems for detection of battery failures that address the problems with conventional methods discussed above and are especially useful in modular UPSs with parallel battery strings connected to a common DC bus.

Figure 5:
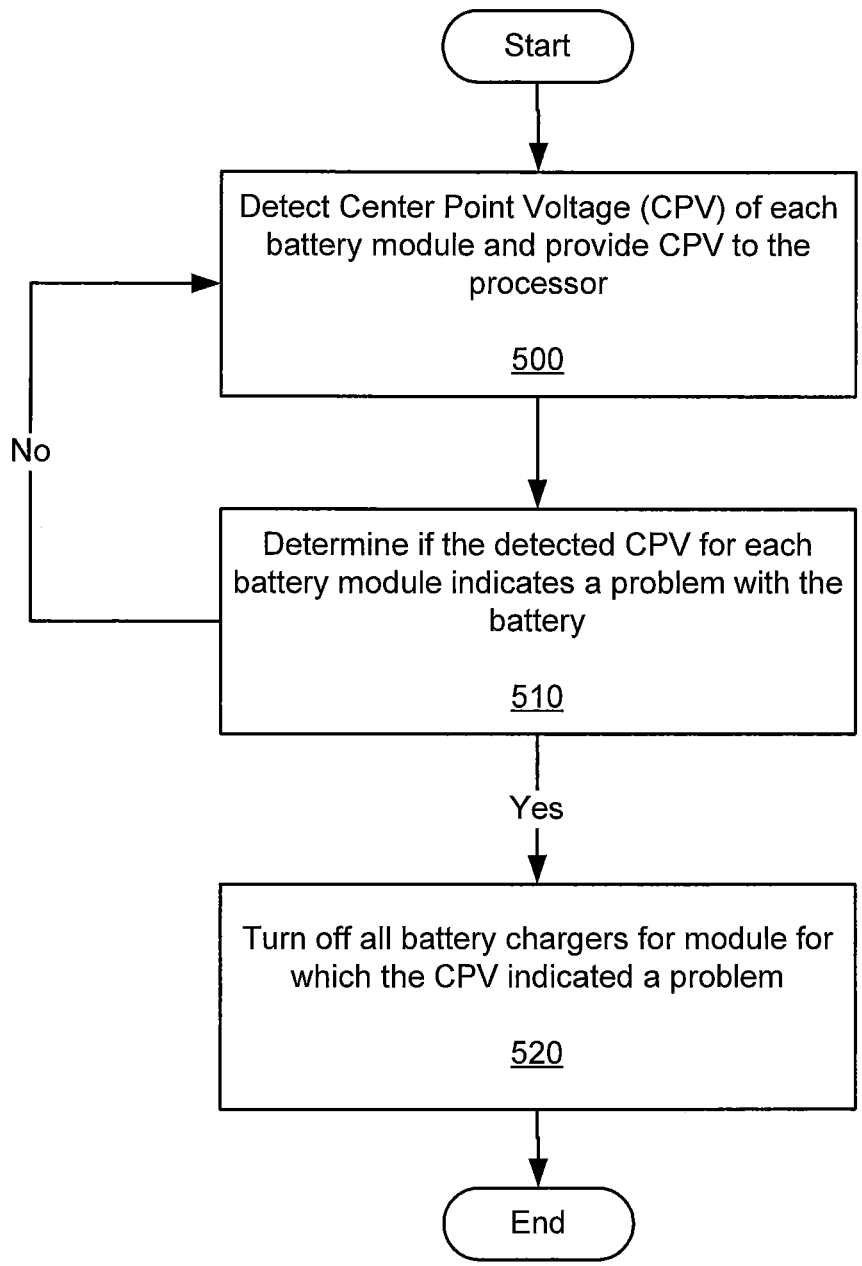
FIGS. 5 and 6 are flowcharts illustrating operations in accordance with some embodiments of the present inventive concept
Figure 6:
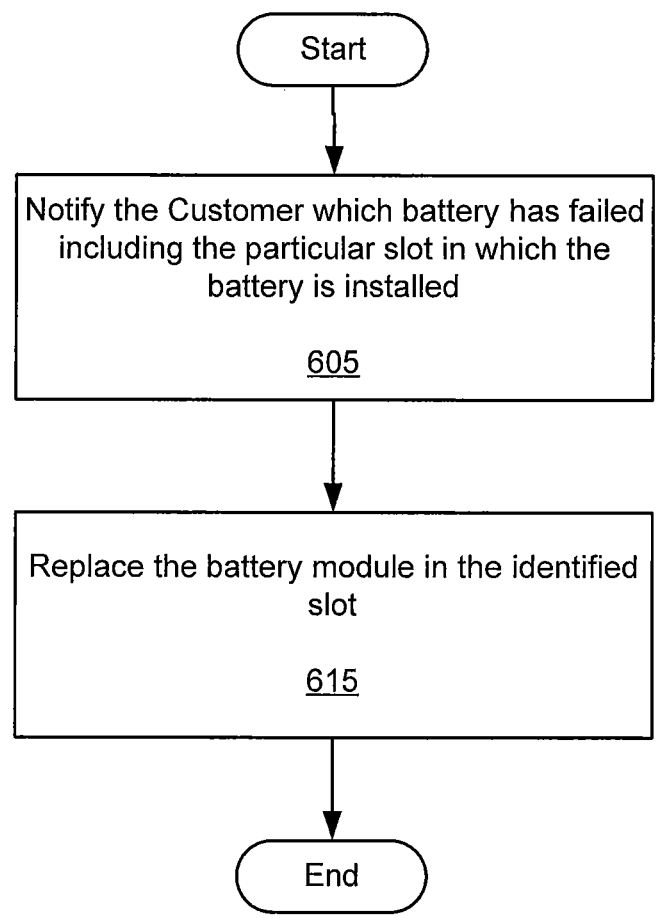

Referring now to FIGS. 5 and 6, operations in accordance with embodiments of the present inventive concept will be discussed. Referring first to FIG. 5, operations for detecting battery failures begin at block 500 by sensing a CPV of a battery module associated with a UPS. The sensed CPV is provided to a processor (block 510). If it is determined that the CPV meets a predetermined voltage threshold operations return to block 500 and repeat until it is determined that that the CPV fails to meet the predetermined threshold. If, on the other hand, it is determined that the CPV fails to meet the predetermined threshold (block 510), operations proceed to block 520 and all battery chargers associated with the battery module are turned off. In some embodiments, the predetermined threshold is no greater than 2.3 volts per cell (V/cell).

Referring now to FIG. 6, once the battery charger is turned off, a customer may be notified of a particular slot in which the battery module is positioned (block 605). In some embodiments, the notification may include sounding an alarm when a failed battery is detected. Finally, the failed battery may be replaced (block 615). Thus, some embodiments of the present inventive concept may allow a customer to avoid messy thermal failures that could occur had the system been blind to the failed battery module. As further discussed above, some embodiments of the present inventive concept may extend the benefits of the ABM to parallel battery systems, which may make the ABMs much more effective.

Figure 7:
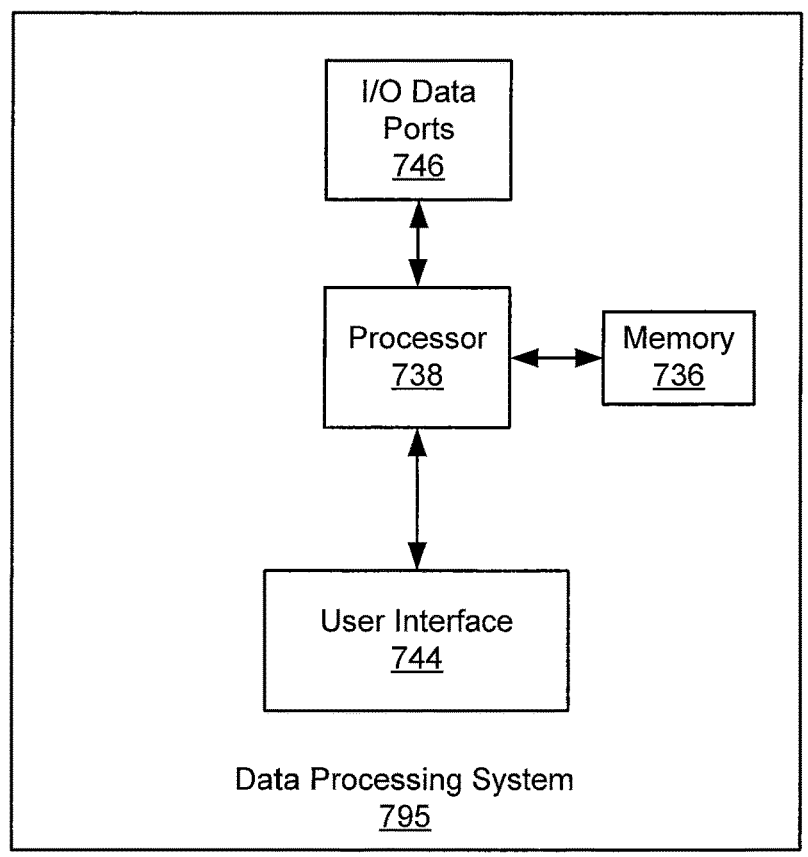
FIG. 7 is a block diagram illustrating a data processor that can be used in accordance with various embodiments of the present inventive concept.

Referring now to FIG. 7, a block diagram of a data processing system 695 that may be included in one or more of the communications module 120 and/or the UPSs in accordance with some embodiments will be discussed. As illustrated in FIG. 6, the data processing system 695 may include a user interface 644, including, for example, input device(s) such as a man machine interface (MMI) including, but not limited to a keyboard or keypad and a touch screen; a display; a speaker and/or microphone; and a memory 636 that communicate with a processor 638. The data processing system 695 may further include I/O data port(s) 646 that also communicates with the processor 638. The I/O data ports 646 can be used to transfer information between the data processing system 695 and another computer system or a network, such as an Internet server, using, for example, an Internet Protocol (IP) connection. These components may be conventional components such as those used in many conventional data processing systems, which may be configured to operate as described herein.

Figure 8:
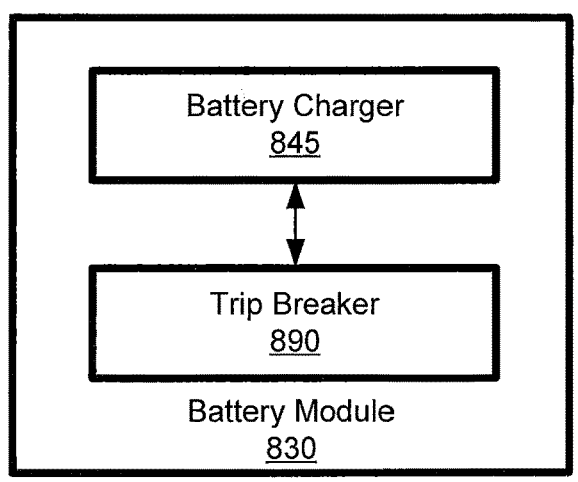
FIG. 8 is block diagram illustrating a battery module including a trip breaker in accordance with some embodiments of the present inventive concept.

Referring now to FIG. 8, a block diagram of a battery module 830 including a battery charger 845 and a trip breaker 890 will be discussed. In embodiments of the present inventive concept discussed above, all battery chargers associated with the battery module are turned off when a bad battery is sensed because the chargers and batteries are connected in parallel. However, in some embodiments, a trip breaker 890 associated with the battery charger 845 may be provided. The presence of the trip breaker 890 in the battery module would allow the CSB to trip off any battery module automatically, thus, allowing the system to continue to charge good batteries and provide a diminished run time, depending on the number of bad battery modules.

Example embodiments are described above with reference to block diagrams and/or flowchart illustrations of methods, devices, systems and/or computer program products. It is understood that a block of the block diagrams and/or flowchart illustrations, and combinations of blocks in the block diagrams and/or flowchart illustrations, can be implemented by computer program instructions. These computer program instructions may be provided to a processor of a general purpose computer, special purpose computer, and/or other programmable data processing apparatus to produce a machine, such that the instructions, which execute via the processor of the computer and/or other programmable data processing apparatus, create means (functionality) and/or structure for implementing the functions/acts specified in the block diagrams and/or flowchart block or blocks.

These computer program instructions may also be stored in a computer-readable memory that can direct a computer or other programmable data processing apparatus to function in a particular manner, such that the instructions stored in the computer-readable memory produce an article of manufacture including instructions which implement the functions/acts specified in the block diagrams and/or flowchart block or blocks.

The computer program instructions may also be loaded onto a computer or other programmable data processing apparatus to cause a series of operational steps to be performed on the computer or other programmable apparatus to produce a computer-implemented process such that the instructions which execute on the computer or other programmable apparatus provide steps for implementing the functions/acts specified in the block diagrams and/or flowchart block or blocks.

Accordingly, example embodiments may be implemented in hardware and/or in software (including firmware, resident software, micro-code, etc.). Furthermore, example embodiments may take the form of a computer program product on a computer-usable or computer-readable storage medium having computer-usable or computer-readable program code embodied in the medium for use by or in connection with an instruction execution system. In the context of this document, a computer-usable or computer-readable medium may be any medium that can contain, store, communicate, propagate, or transport the program for use by or in connection with the instruction execution system, apparatus, or device.

The computer-usable or computer-readable medium may be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection having one or more wires, a portable computer diskette, a random access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Computer program code for carrying out operations of data processing systems discussed herein may be written in a high-level programming language, such as Java, AJAX (Asynchronous JavaScript), C, and/or C++, for development convenience. In addition, computer program code for carrying out operations of example embodiments may also be written in other programming languages, such as, but not limited to, interpreted languages. Some modules or routines may be written in assembly language or even micro-code to enhance performance and/or memory usage. However, embodiments are not limited to a particular programming language. It will be further appreciated that the functionality of any or all of the program modules may also be implemented using discrete hardware components, one or more application specific integrated circuits (ASICs), or a field programmable gate array (FPGA), or a programmed digital signal processor, a programmed logic controller (PLC), or microcontroller.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated.

In the drawings and specification, there have been disclosed example embodiments of the inventive concept. Although specific terms are employed, they are used in a generic and descriptive sense only and not for purposes of limitation, the scope of the inventive concept being defined by the following claims.

That which is claimed:

1. An uninterruptible power supply (UPS) comprising:
a processor;
a voltage sensor circuit in communication with the processor,
wherein the voltage sensor circuit is configured to sense a center point voltage (CPV) of a battery module including at least one battery cell associated with the UPS and provide the sensed CPV to the processor;
wherein the processor is configured to receive the sensed CPV of the battery module, determine if the CPV is less than a predetermined voltage indicating presence of at least one bad battery and turn off all battery chargers associated with the battery module if the CPV is determined to be less than the predetermined voltage indicating presence of at least one bad battery based only on the CPV of the battery module; and
wherein the CPV represents a voltage per battery cell (V/cell) after being charged for a predetermined amount of time of at least twenty-four hours.

2. The UPS of claim 1, wherein the processor is further configured to notify a customer of a particular slot in which the battery module is positioned if the CPV is determined to be less than the predetermined voltage after the predetermined amount of time.

3. The UPS of claim 2:
wherein the predetermined voltage is about 2.3 volts; and
wherein the processor is further configured to sound an alarm responsive to determining that the CPV is less than the predetermined voltage after the predetermined amount of time.

4. The UPS of claim 1, wherein the UPS comprises at least one battery string.

5. The UPS of claim 1, wherein the battery module is positioned in an external battery module (EBM) external to the UPS and in communication with the UPS.

6. The UPS of claim 1, wherein the predetermined voltage is 2.3 volts.

7. A system for detection of battery failures, the system comprising:
an uninterruptible power supply (UPS);
a processor associated with the UPS;
a battery module including at least one battery cell associated with the UPS and the processor; and
a voltage sensor circuit in communication with the processor, the voltage sensor circuit configured to sense a center point voltage (CPV) of the battery module associated with the UPS and provide the sensed CPV to the processor; and
wherein the processor is configured to receive the sensed CPV of the battery module, determine if the CPV is less than a predetermined voltage indicating presence of at least one bad battery based and turn off all battery chargers associated with the battery module if the CPV is determined to be less than the predetermined voltage indicating presence of at least one bad battery based only on the CPV of the battery module; and
wherein the CPV represents a voltage per battery cell (V/cell) after being charged for a predetermined amount of time of at least twenty-four hours.

8. The system of claim 7, wherein the processor is further configured to notify a customer of a particular slot in which the battery module is positioned if the CPV is determined to be less than the predetermined voltage after the predetermined amount of time.

9. The system of claim 8:
wherein the predetermined voltage is a voltage of about 2.3 volts; and
wherein the processor is further configured to sound an alarm responsive to determining that the CPV is less than the predetermined voltage.

10. The system of claim 8, wherein the UPS comprises at least one battery string.

11. The system of claim 8, further comprising an external battery module (EBM) external to the UPS and in communication with the UPS, wherein the battery module is positioned in the EBM.

12. The system of claim 8, wherein the predetermined voltage is 2.3 volts.

13. A method for detecting battery failures, the method comprising:
sensing a center point voltage (CPV) of a battery module including at least one battery cell associated with a UPS;
providing the sensed CPV to a processor;
determining if the CPV is less than a predetermined voltage; and turning off all battery chargers associated with the battery module if the CPV is determined to be less than the predetermined voltage indicating presence of at least one bad battery based only on the CPV of the battery module, wherein the CPV represents a voltage per battery cell (V/cell) after being charged for a predetermined amount of time of at least twenty-four hours.

14. The method of claim 13, further comprising notifying a customer of a particular slot in which the battery module is positioned if the CPV is determined to be less than the predetermined voltage after the predetermined amount of time.

15. The method of claim 14, further comprising replacing the battery module.

16. The method of claim 13, wherein the predetermined voltage is a voltage of about 2.3 volts, the method further comprising sounding an alarm responsive to determining that the CPV is less than the predetermined voltage.

17. The method of claim 13, wherein the UPS comprises at least one battery string.

18. The method of claim 13, wherein the battery module is positioned in an external battery module (EBM) external to the UPS and in communication with the UPS.

19. The method of claim 13, wherein the predetermined voltage is 2.3 volts.

* * * * *